(12) United States Patent
You

(10) Patent No.: US 12,230,336 B2
(45) Date of Patent: Feb. 18, 2025

(54) SEMICONDUCTOR MEMORY DEVICE, AND METHOD OPERATING BASED ON STATUS CHECKER

(71) Applicant: SK hynix Inc., Icheon-si (KR)

(72) Inventor: Byoung Sung You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 170 days.

(21) Appl. No.: 17/881,012

(22) Filed: Aug. 4, 2022

(65) Prior Publication Data
US 2023/0317183 A1   Oct. 5, 2023

(30) Foreign Application Priority Data
Mar. 16, 2022   (KR) .................. 10-2022-0032965

(51) Int. Cl.
| | |
|---|---|
| G11C 16/34 | (2006.01) |
| G11C 7/10 | (2006.01) |
| G11C 16/10 | (2006.01) |
| G11C 16/16 | (2006.01) |
| G11C 16/26 | (2006.01) |

(52) U.S. Cl.
CPC ........ G11C 16/3459 (2013.01); G11C 7/1039 (2013.01); G11C 16/102 (2013.01); G11C 16/16 (2013.01); G11C 16/26 (2013.01)

(58) Field of Classification Search
CPC . G11C 16/3459; G11C 7/1039; G11C 16/102; G11C 16/16; G11C 16/26
See application file for complete search history.

(56) References Cited

U.S. PATENT DOCUMENTS 11,862,250 B2 *   1/2024   Guo .................... G11C 16/08

FOREIGN PATENT DOCUMENTS

| KR | 1020150139112 A | 12/2015 |
|---|---|---|
| KR | 1020210051873 A | 5/2021 |

* cited by examiner

*Primary Examiner* — Vanthu T Nguyen
(74) *Attorney, Agent, or Firm* — William Park & Associates Ltd.

(57) ABSTRACT

A semiconductor memory device includes a plurality of memory blocks, a peripheral circuit, control logic, and a status checker. Each of the plurality of memory blocks includes a plurality of physical pages. The peripheral circuit is configured to perform a program operation, an erase operation, or a read operation on a selected memory block among the plurality of memory blocks. The control logic controls the program operation, the erase operation, or the read operation of the peripheral circuit. The status checker checks a ratio of a programmed page among the physical pages included in the plurality of memory blocks.

13 Claims, 18 Drawing Sheets

| Programmed Page Ratio | LESS THAN 50% | 50%~90% | GREATER THAN 90% |
|---|---|---|---|
| INF_PGM | CODE1 | CODE2 | CODE3 |

FIG. 15

| INF_PGM | CODE1 | CODE2 | CODE3 |
|---|---|---|---|
| GARBAGE COLLECTION POLICY | FIRST FREQUENCY | SECOND FREQUENCY | FORCIBILITY |

SEMICONDUCTOR MEMORY DEVICE, AND METHOD OPERATING BASED ON STATUS CHECKER

CROSS-REFERENCE TO RELATED APPLICATION

The present application claims priority under 35 U.S.C. § 119 (a) to Korean patent application number 10-2022-0032965, filed on Mar. 16, 2022, in the Korean Intellectual Property Office, the entire disclosure of which is incorporated herein by reference.

BACKGROUND

1. Technical Field

The present disclosure relates to an electronic device, and more particularly, to a semiconductor memory device, a controller, and a method of operating the semiconductor memory device and the controller.

2. Related Art

A semiconductor memory device may be formed in a two-dimensional structure in which strings are horizontally arranged on a semiconductor substrate, or may be formed in a three-dimensional structure in which the strings are vertically stacked on the semiconductor substrate. A three-dimensional semiconductor memory device is a semiconductor memory device designed to resolve a limit of an integration degree of a two-dimensional memory device, and may include a plurality of memory cells that are vertically stacked on a semiconductor substrate. Meanwhile, a controller may control an operation of the semiconductor memory device.

SUMMARY

An embodiment of the present disclosure is directed to a semiconductor memory device and a controller for performing garbage collection.

According to an embodiment of the present disclosure, a semiconductor memory device includes a plurality of memory blocks, a peripheral circuit, control logic, and a status checker. Each of the plurality of memory blocks includes a plurality of physical pages. The peripheral circuit is configured to perform a program operation, an erase operation, or a read operation on a selected memory block among the plurality of memory blocks. The control logic is capable of controlling the program operation, the erase operation, or the read operation of the peripheral circuit. The status checker is configured to check a ratio of a programmed page among the physical pages included in the plurality of memory blocks.

In an embodiment, the semiconductor memory device may further include a status storage device configured to store information indicating the ratio of the programmed pages.

In accordance with the present disclosure is a method of operating a controller for controlling an operation of a semiconductor memory device including a plurality of pages. The method includes generating a command for checking a programmed page ratio among the plurality of pages, transmitting the command to the semiconductor memory device, receiving information on the programmed page ratio from the semiconductor memory device, and determining a garbage collection policy of the semiconductor memory device based on the received information.

In an embodiment, the method may further include controlling the semiconductor memory device to perform a garbage collection operation, based on the determined garbage collection policy.

Also in accordance with the present embodiment is another method of operating a semiconductor memory device including a plurality of pages. The method includes receiving a command for checking a ratio of programmed pages among the plurality of pages, checking the ratio of the programmed pages among the plurality of pages, and generating a code value for the checked ratio based on a range of ratios to which the checked ratio belongs.

In an embodiment, the method may further include storing the generated code value.

In an embodiment, the method may further include outputting the generated code value.

The present technology may provide a semiconductor memory device and a controller for performing garbage collection.

BRIEF DESCRIPTION OF THE DRAWINGS

FIG. 15 is a table illustrating an example of a garbage collection policy according to the program information.

DETAILED DESCRIPTION

Specific structural or functional descriptions of embodiments disclosed in the present specification or application are illustrated only to describe the concept of the present disclosure. Embodiments according to the concept of the present disclosure may be carried out in various forms and should not be construed as being limited to the particular embodiments described in the present specification or application.

Figure 1:
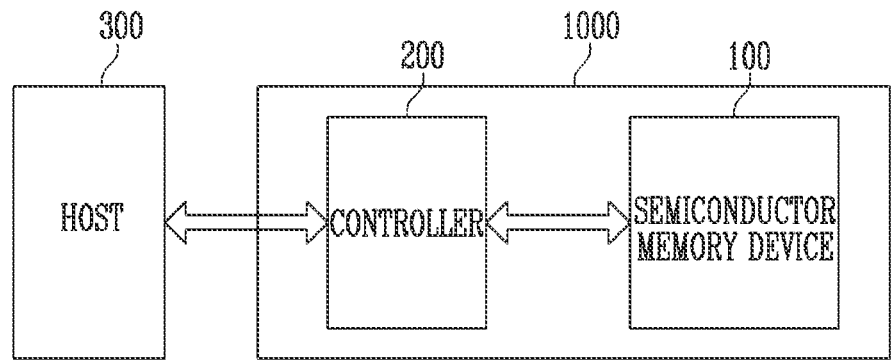
FIG. 1 is a block diagram illustrating a memory system including a semiconductor memory device and a controller according to an embodiment of the present disclosure.

FIG. 1 is a block diagram illustrating a memory system 1000 including a semiconductor memory device 100 and a controller 200 according to an embodiment of the present disclosure.

Referring to FIG. 1, the memory system 1000 includes the semiconductor memory device 100 and the controller 200. In addition, the memory system communicates with a host 300. The controller 200 controls an overall operation of the semiconductor memory device 100. In addition, the controller 200 controls the operation of the semiconductor memory device 100 based on a command received from the host 300.

The controller 200 may also perform a garbage collection operation on a plurality of memory blocks included in the semiconductor memory device 100. In general, the garbage collection operation may be performed by a controller's own block manager. The block manager of the controller may include information indicating whether each of the plurality of memory blocks included in the semiconductor memory device 100 is a free block, an open block, or a closed block. A free block may refer to a memory block in which data is not stored, an open block may refer to a memory block in which data is stored in some pages in the block, and a closed block may refer to a memory block in which data is stored in all pages in the block. Meanwhile, the controller may control the semiconductor memory device to perform the garbage collection operation based on the number of free blocks in the semiconductor memory device. For example, when the number of free blocks in the semiconductor memory device is equal to or greater than a first threshold value, because the number of free blocks is in a relatively sufficient status, the controller 200 may control the semiconductor memory device 100 to perform the garbage collection operation according to a relatively low first frequency. In this case, the garbage collection operation may be performed as a background operation. Meanwhile, when the number of free blocks in the semiconductor memory device is less than the first threshold value and equal to or greater than a second threshold value, the controller 200 may control the semiconductor memory device 100 to perform the garbage collection operation according to a second frequency that is relatively higher than the first frequency. Also in this case, the garbage collection operation may be performed as a background operation. In addition, when the number of free blocks in the semiconductor memory device is less than the second threshold value, because the number of free blocks is relatively insufficient, whenever the controller 200 receives a write request from the host 300, the controller 200 may control the semiconductor memory device 100 to perform the garbage collection operation before processing the write request. In this case, the garbage collection operation may be performed as a foreground operation.

As described above, when a garbage collection policy is determined based on the number of free blocks, the garbage collection operation may be performed more frequently than actually necessary. This becomes a factor that slows down a response to a request received from the host 300 and becomes a factor that deteriorates operation performance of the entire memory system due to frequent performance of an unnecessary background operation. In addition, when the garbage collection operation is frequently performed, performance of memory cells included in a memory cell array 110 of the semiconductor memory device 100 is rapidly deteriorated.

According to embodiments of the present disclosure, the semiconductor memory device 100 checks a ratio of a page actually programmed in a selected block under the control of the controller 200, and transmits information indicating the ratio to the controller 200. The controller 200 may determine the garbage collection policy based on the received information. Therefore, according to embodiments of the present disclosure, the garbage collection operation may be performed more efficiently compared to the existing technique of establishing a garbage collection policy based on the number of free blocks.

Figure 2:
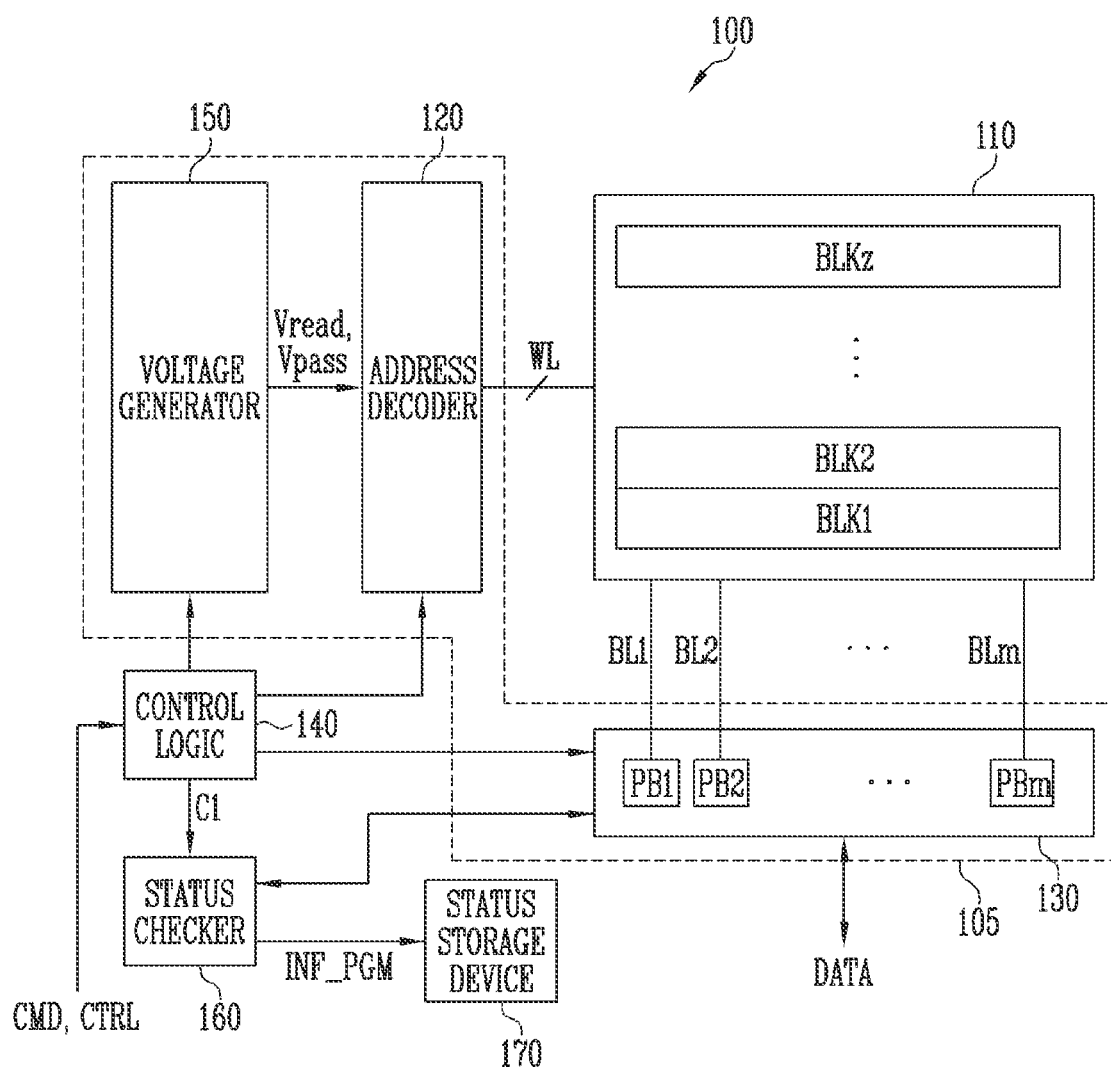
FIG. 2 is a block diagram illustrating the semiconductor memory device of FIG. 1.

FIG. 2 is a block diagram illustrating the semiconductor memory device of FIG. 1.

Referring to FIG. 2, the semiconductor memory device 100 includes a memory cell array 110, an address decoder 120, a read and write circuit 130, control logic 140, a voltage generator 150, a status checker 160, and a status storage device 170.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit 105 that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block for a read voltage application operation during a read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request for the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through respective bit lines BL1 to BLm. During the read operation and the program verify operation, in order to sense a threshold voltage of the memory cells, the plurality of page buffers PB1 to PBm sense a change of an amount of a current flowing according to a program status of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. As an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140. As described above, the voltage generator 150 may include the charge pump, and the charge pump may include the plurality of pumping capacitors described above. A specific configuration of the charge pump included in the voltage generator 150 may be variously designed as necessary.

The status checker 160 may check a status of the memory blocks included in the memory cell array 110, based on a control signal C1 output from the control logic 140. The control logic 140 may output the control signal C1 based on a set-feature command received from the controller 200. The set-feature command received from the controller 200 is described later with reference to FIG. 14.

More specifically, the status checker 160 may be connected to the plurality of page buffers PB1 to PBm included in the read and write circuit 130. The status checker 160 may check a status of memory cells included in a selected memory block among the memory blocks BLK1 to BLKz included in the memory cell array 110, based on a bit data stored in a latch in the plurality of page buffers PB1 to PBm. More specifically, the status checker 160 may check the ratio of the programmed page among the memory cells included in the selected memory block. The status checker 160 may generate "program status information INF_PGM" which is information indicating the "ratio of programmed page" of the selected memory block. An embodiment of the status checker 160 is described later with reference to FIGS. 6 to 13.

The status storage device 170 may store information indicating a current operating status of the semiconductor memory device 100. Specifically, the status storage device 170 may store information indicating whether the semiconductor memory device 100 is currently operating or performing a specific operation. In addition, the status storage device 170 may store the program status information INF_PGM generated by the status checker. For some embodiments, the status storage device 170 includes electronic memory. According to an embodiment, the status storage device 170 may be implemented as at least one status register that stores specific information. The information stored in the status storage device 170 may be transmitted to the controller 200.

Figure 3:
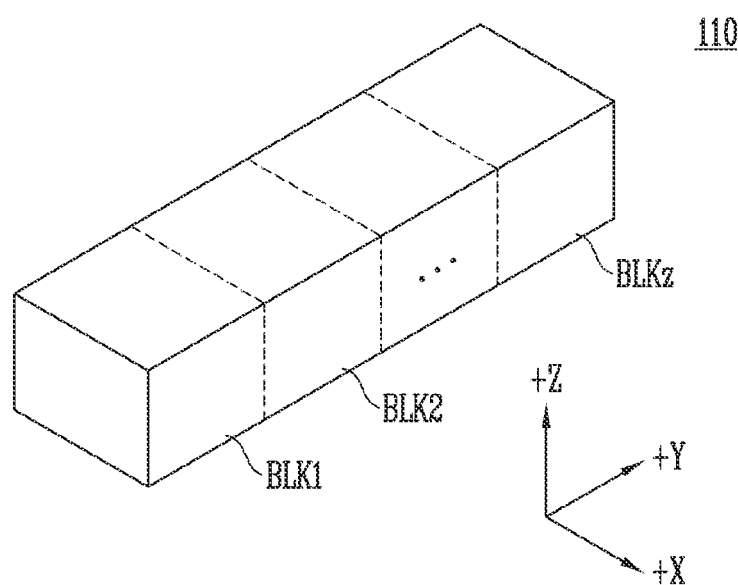
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIG. 4.

Figure 4:
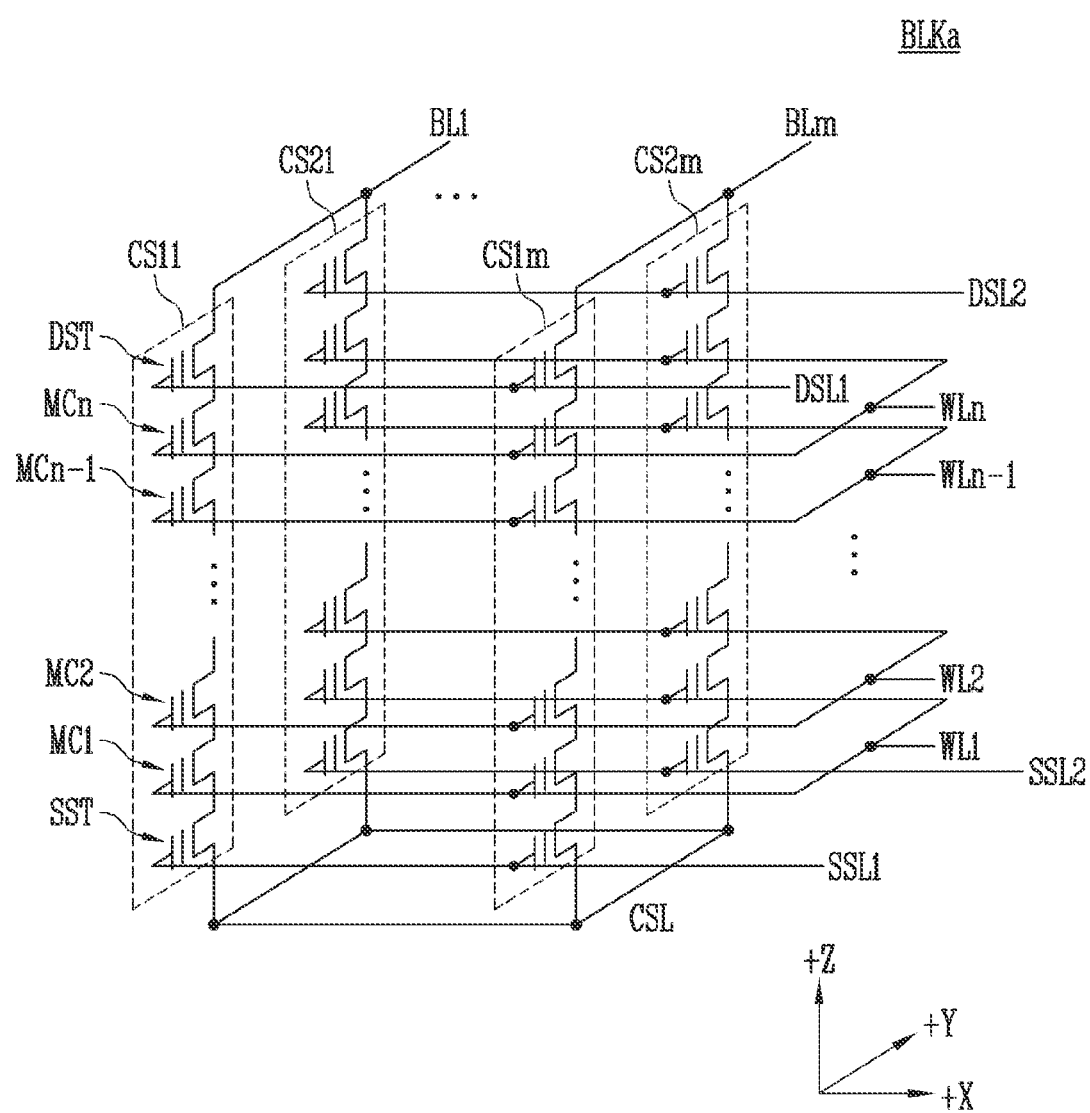
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1*m* and CS21 to CS2*m*. In the memory block BLKa, m cell strings are arranged in a row direction (that is, the +X direction). In FIG. 4, two cell strings are arranged in a column direction (that is, the +Y direction). However, this is for convenience of description, and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1*m* of a first row are connected to a first source select line SSL1. The source select transistors of the cell strings CS21 to CS2*m* of a second row are connected to a second source select line SSL2.

In another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

Gates of the first to n-th memory cells MC1 to MCn of each cell string are connected to the first to n-th word lines WL1 to WLn, respectively.

The drain select transistor DST of each cell string is connected between a corresponding bit line and the memory cells MC1 to MCn. The drain select transistors DST of the cell string arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1*m* or CS21 to CS2*m* arranged in the row direction may be connected to the even bit lines, and odd-numbered cell strings among the cell strings CS11 to CS1*m* or CS21 to CS2*m* arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKa is improved, however, the size, that is, a physical dimension of the memory block BLKa increases. As less dummy memory cells are provided, the size, that is, the physical dimension of the memory block BLKa may be reduced, however, the reliability of the operation for the memory block BLKa may be reduced.

Referring to FIG. 4, each of the plurality of cell strings CS11 to CS1*m* and CS21 and CS2*m* may be formed in an "I" shape between the bit lines BL1 to BLm and the common source line CSL. However, this is an example, and a memory block of another type is also possible. For example, each of the plurality of cell strings included in the memory block may be formed in a 'U' shape. In this case, each cell string may include a pipe transistor. In addition, memory cells of a first group among the memory cells included in each cell string may be connected in series between the source select transistor and the pipe transistor. That is, the memory cells of the first group and memory cells of a second group may be connected through the pipe transistor. Meanwhile, the memory cells of the first group among the memory cells included in each cell string may be connected in series between the pipe transistor and the drain select transistor. A gate of the pipe transistor of each cell string may be connected to a pipeline.

Figure 5:
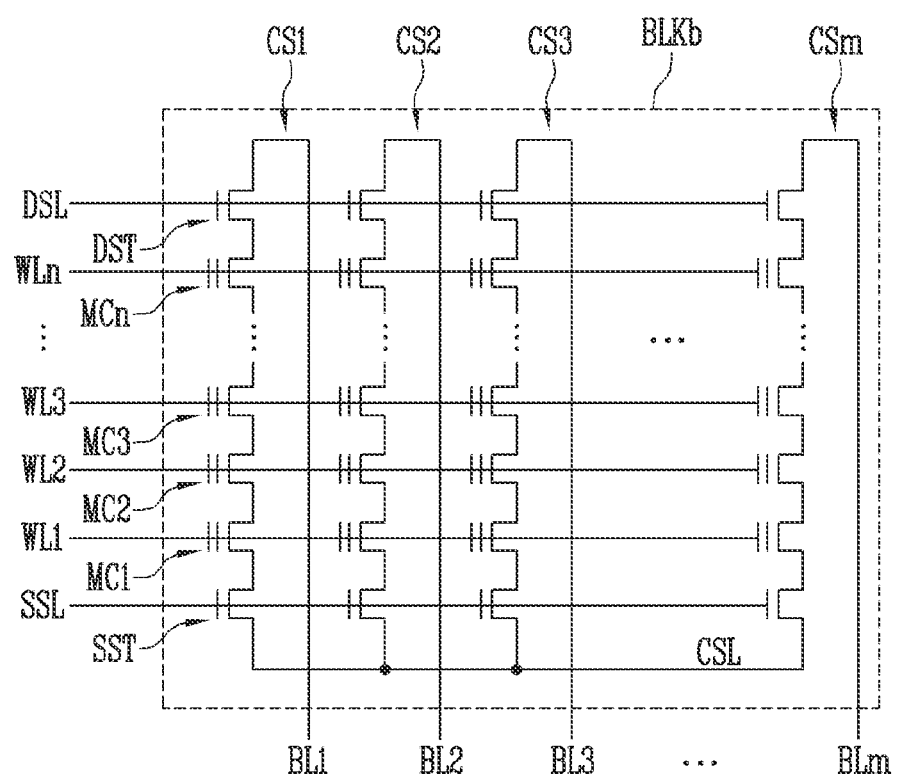
FIG. 5 is a circuit diagram illustrating an embodiment of any one memory block BLKb among the plurality of memory blocks BLK1 to BLKz included in the memory cell array 110 of FIG. 2.

FIG. 5 is a circuit diagram illustrating an embodiment of any one memory block BLKb among the plurality of memory blocks BLK1 to BLKz included in the memory cell array 110 of FIG. 2.

Referring to FIG. 5, the memory block BLKb includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 6:
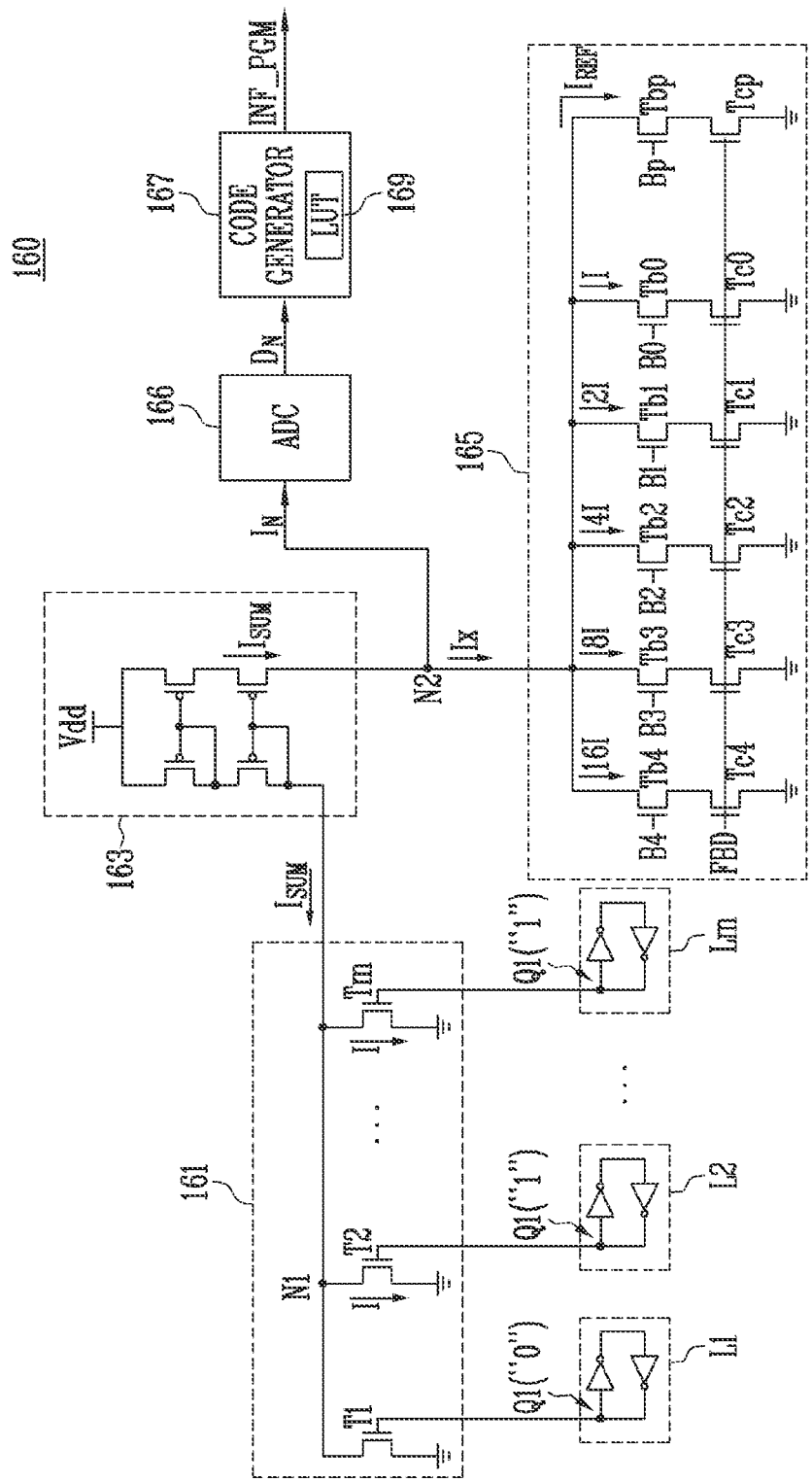
FIG. 6 is a circuit diagram illustrating an embodiment of a status checker 160 of FIG. 2.

FIG. 6 is a circuit diagram illustrating an embodiment of the status checker 160 of FIG. 2.

Referring to FIG. 6, the status checker 160 includes a sensing current generator 161, a current mirror 163, a comparison current generator 165, an analog-to-digital converter 166, and a code generator 167. The sensing current generator 161 may include first to m-th transistors T1 to Tm connected to a node N1. A gate terminal of each of the first to m-th transistors T1 to Tm is connected to a corresponding latch among first to m-th latches L1 to Lm. The first to m-th latches L1 to Lm may be latches respectively included in the first to m-th page buffers PB1 to PBm shown in FIG. 2. The first to m-th latches L1 to Lm may be sensing latches in the page buffer, and may store bit data indicating whether each of the memory cells in the selected memory block is programmed. In an embodiment, when the memory cell is in an erase status, a voltage value of a node Q1 in the latch corresponding to the corresponding memory cell may be a logic-high value indicated by "1." In an example of FIG. 6, the voltage value of the node Q1 of the second latch L2 and the m-th latch Lm may be a logic high value. In addition, when the memory cell is in a program status, the voltage value of the node Q1 in the latch corresponding to the corresponding memory cell may be a logic-low value indicated by "0." In the example of FIG. 6, the voltage value of the node Q1 of the first latch L1 may be a logic low value.

Accordingly, the transistor connected to the latch corresponding to the memory cell of the erase status is turned on, and the transistor connected to the latch corresponding to the memory cell of the program status is turned off. In the example of FIG. 6, the second transistor T2 and the m-th transistor Tm are turned on, and the first transistor T1 is turned off.

A current I flows through each of the second transistor T2 and the m-th transistor Tm, and a current does not flow through the first transistor T1. That is, the current I flows through each turned-on transistor among the first to m-th transistors T1 to Tm, and a current does not flow through the turned-off transistor. Accordingly, a current $I_{SUM}$ of the node N1 may be expressed as Equation 1 below.

$$\text{ISUM} = N_{EC} * I \qquad \text{[Equation 1]}$$

In Equation 1 above, $N_{EC}$ indicates the number of memory cells of the erase status, which are not programmed. That is, $I_{SUM}$ indicates a current value corresponding to the number of memory cells in the erase status.

Meanwhile, the current mirror 163 is connected to the node N1 and a node N2. Because a current flowing from the current mirror 163 to the node N1 is $I_{SUM}$, the current flowing from the current mirror 163 to the node N2 also becomes the $I_{SUM}$. The current mirror 163 shown in FIG. 6 serves as an example, and other various types of current mirrors may be used.

Meanwhile, the comparison current generator 165 includes bypass transistors Tbp, Tb0, Tb1, Tb2, Tb3, and Tb4 connected to the node N2 and control transistors Tcp, Tc0, Tc1, Tc2, Tc3, and Tc4 respectively connected between the bypass transistors and a ground. The bypass transistors Tbp, Tb0, Tb1, Tb2, Tb3, and Tb4 may be controlled by individual bypass control signals BP, B0, B1, B2, B3, and B4, respectively, and the control transistors Tcp, Tc0, Tc1, Tc2, Tc3, and Tc4 may be collectively controlled by a common control signal FBD.

When the bypass transistor Tbp and the control transistor Tcp are turned on, a current flowing through the bypass transistor Tbp and the control transistor Tcp is a reference current $I_{REF}$. Meanwhile, when the bypass transistor Tb0 and the control transistor Tc0 are turned on, a current flowing through the bypass transistor Tb0 and the control transistor Tc0 may be the current I flowing when a single transistor is turned on in the sensing current generator 161. In addition, when the bypass transistor Tb1 and the control transistor Tc1 are turned on, a current flowing through the bypass transistor Tb1 and the control transistor Tc1 may be twice the current I flowing when the single transistor is turned on in the sensing current generator 161. In addition, when the bypass transistor Tb2 and the control transistor Tc2 are turned on, a current flowing through the bypass transistor Tb2 and the control transistor Tc2 may be four times the current I flowing when the single transistor is turned on in the sensing current generator 161. In addition, when the bypass transistor Tb3 and the control transistor Tc3 are turned on, a current flowing through the bypass transistor Tb3 and the control transistor Tc3 may be eight times the current I flowing when the single transistor is turned on in the sensing current generator 161. In addition, when the bypass transistor Tb4 and the control transistor Tc4 are turned on, a current flowing through the bypass transistor Tb4 and the control transistor Tc4 may be sixteen times the current I flowing when the single transistor is turned on in the sensing current generator 161.

Accordingly, when the common control signal FBD is a logic-high voltage that turns on the control transistors Tcp, Tc0, Tc1, Tc2, Tc3, and Tc4, a comparison current Ix flowing from the node N2 to the comparison current generator 165 may be expressed as Equation 2 below.

$$Ix=(16*x4+8*x3+4*x2+2*x1+x0)*I+xp*I_{REF}$$ [Equation 2]

In Equation 2 above, xp, x0, x1, x2, x3, and x4 may be bit values corresponding to voltage values of the bypass control signals BP, B0, B1, B2, B3, and B4, respectively. For example, when the bypass control signal BP is a logic-high voltage that turns on the bypass transistor Tbp, a value of xp becomes one (1). Conversely, when the bypass control signal BP is a logic-low voltage that turns off the bypass transistor Tbp, the value of xp becomes zero (0). The values of x0, x1, x2, x3, and x4 may also be determined in a similar method.

That is, the comparison current generator 165 may generate the comparison current Ix of various levels by a combination of the bypass control signals BP, B0, B1, B2, B3, and B4.

Referring to FIG. 6, a current $I_N$ flows from the node N2 to the analog-to-digital converter 166. The current $I_N$ may be expressed as Equation 3 below.

$$I_N=I_{SUM}-I_X$$ [Equation 3]

The analog-to-digital converter 166 converts an analog current level of the current $I_N$ into a digital value $D_N$. The digital value $D_N$ output from the analog-to-digital converter 166 is a value corresponding to the number of memory cells which are not programmed.

The code generator 167 may generate the program status information INF_PGM based on the digital value $D_N$ corresponding to the number of memory cells which are not programmed. To this end, the code generator 167 may include a lookup table (LUT) 169. The code generator 167 may generate a code corresponding to the digital value $D_N$ corresponding to the number of memory cells which are not programmed, by referring to the lookup table 169. The generated code may be included in the program status information INF_PGM. The code generated by referring to the lookup table 169 is described later with reference to FIG. 13.

In the above, an operation of the status checker 160 is described based on the memory cells included in one physical page. According to the present disclosure, in order to check a ratio of a programmed page among a plurality of physical pages included in a semiconductor memory device, the bit values are respectively stored in the latches L1 to Lm of the page buffer by performing a sensing operation by applying a check voltage to all word lines in a state in which all memory blocks are activated. Because the check voltage has a voltage value greater than the read voltage, a ratio of 0 bit stored in the latches L1 to Lm of the page buffer may be determined according to the ratio of the programmed physical page. Bits stored in the latches L1 to Lm of the page buffer when the bit values are respectively stored in the latches L1 to Lm of the page buffer by applying the check voltage to all word lines in the state in which all memory blocks are activated are described in detail with reference to FIGS. 7 to 12.

Figure 7:
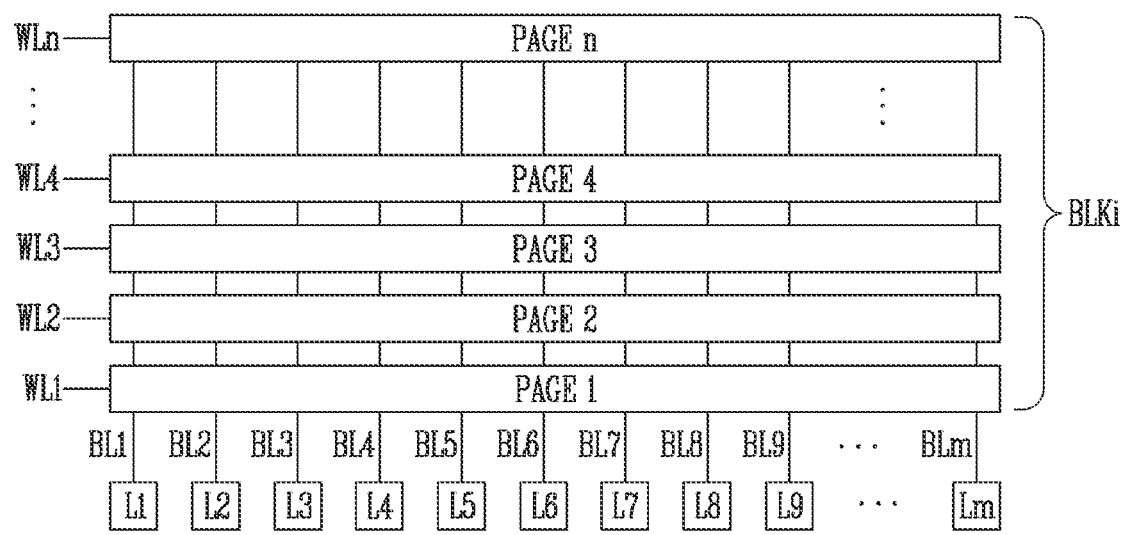
FIG. 7 is a diagram schematically illustrating a connection relationship between a physical page and latches L1 to Lm.

FIG. 7 is a diagram schematically illustrating a connection relationship between the physical page and the latches L1 to Lm.

Referring to FIG. 7, first to n-th pages PAGE 1 to PAGE n included in an i-th memory block BLKi are shown. The first to n-th pages PAGE 1 to PAGE n may be physical pages, respectively. In addition, each of the first to n-th pages PAGE 1 to PAGE n may be connected to a corresponding word line among the first to n-th word lines WL1 to WLn. In addition, each of the first to n-th pages PAGE 1 to PAGE n may include m memory cells.

Meanwhile, the first to n-th pages PAGE 1 to PAGE n may be connected to the first to m-th bit lines BL1 to BLm. The first to n-th pages PAGE 1 to PAGE n may be connected to the first to m-th latches L1 to Lm through the first to m-th bit lines BL1 to BLm. Each of the first to m-th latches L1 to Lm may be included in a corresponding page buffer among the page buffers PB1 to PBm shown in FIG. 2. For convenience of discussion, in FIG. 7, a detailed configuration of the page buffer is not shown, and only the first to m-th latches L1 to Lm are shown.

When data is stored in an i-th memory block of an initial erase status, first, the first page PAGE 1 may be programmed. That is, the first page PAGE 1 to the n-th page PAGE n may be sequentially programmed. However, this is an example, and the program may proceed in an opposite direction.

Figure 8:
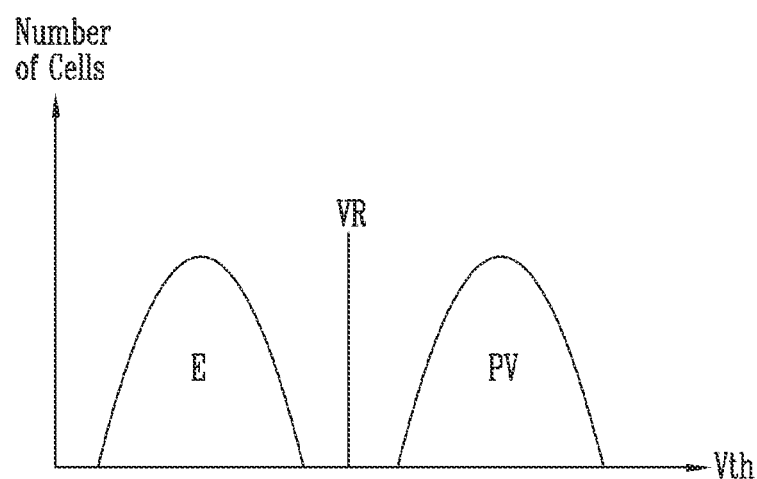
FIG. 8 is a graph illustrating a threshold voltage distribution of a single-level cell (SLC).

FIG. 8 is a graph illustrating a threshold voltage distribution of an SLC. Referring to FIG. 8, when the memory cells included in the physical page are SLCs, a threshold voltage of the memory cells after the program operation belongs to any one of an erase status E or a program status PV. In this case, the threshold voltage of the memory cells may be distinguished through a read voltage VR. Hereinafter, for convenience of discussion, the present disclosure is described with reference to the SLC. However, the present disclosure may be applied to not only the SLC, but also an MLC, a triple-level cell (TLC), a quadruple-level cell (QLC), or the like.

Figure 9A:
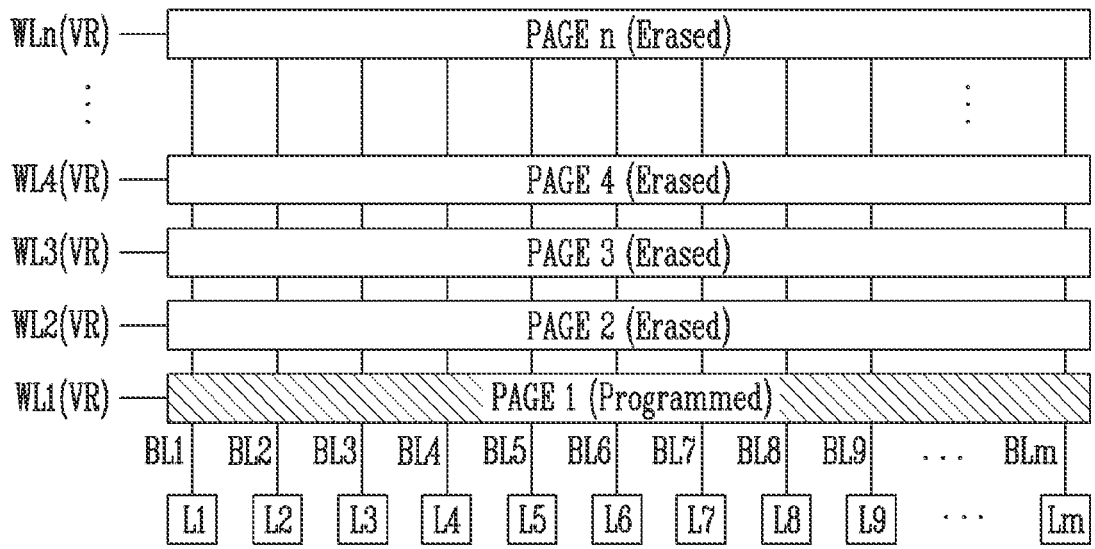
FIG. 9A is a block diagram illustrating a sensing operation of applying a read voltage VR to all word lines in a state in which one page among pages included in a memory block is programmed.
Figure 9B:
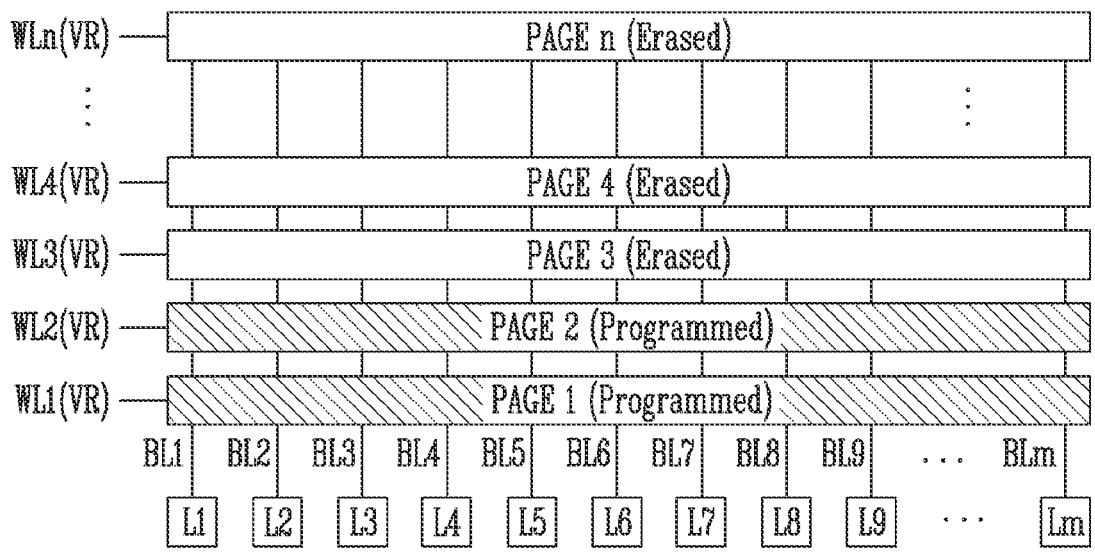
FIG. 9B is a block diagram illustrating the sensing operation of applying the read voltage VR to all word lines in a state in which two pages among the pages included in the memory block are programmed.

FIG. 9A is a block diagram illustrating a sensing operation of applying the read voltage VR to all word lines in a state in which one page among the pages included in the memory block is programmed. FIG. 9B is a block diagram illustrating the sensing operation of applying the read voltage VR to all word lines in a state in which two pages among the pages included in the memory block are programmed.

Referring to FIG. 9A, data is programmed in the first page PAGE 1, and second to n-th pages PAGE 2 to PAGE n are in an erase status. In this case, the threshold voltage of the memory cells included in the first page PAGE 1 belongs to any one of the erase status E or the program status PV shown in FIG. 8. On the other hand, the threshold voltage of all memory cells included in the second to n-th pages PAGE 2 to PAGE n belongs to the erase status E shown in FIG. 8. In this state, when the sensing operation is performed by simultaneously applying the read voltage VR to the first to n-th word lines WL1 to WLn, this operates substantially identically to a read operation on the first page PAGE 1. That is, the bit stored in the first to m-th latches L1 to Lm is determined according to the threshold voltage of the memory cells included in the first page PAGE 1. For example, when the threshold voltage of the memory cell connected to the first bit line BL1 among the memory cells included in the first page PAGE 1 belongs to the erase status E, the bit stored in the first latch L1 may be "1." In addition, for example, when the threshold voltage of the memory cell connected to the second bit line BL2 among the memory cells included in the first page PAGE 1 belongs to the program status PV, the bit stored in the second latch L2 may be "0."

Referring to FIG. 9B, data is programmed in the first page PAGE 1 and the second page PAGE 2, and the third to n-th pages PAGE 3 to PAGE n are in the erase status. In this case, the threshold voltage of the memory cells included in the first page PAGE 1 and the second page PAGE 2 belongs to any one of the erase status E or the program status PV shown in FIG. 8. On the other hand, the threshold voltage of all memory cells included in the third to n-th pages PAGE 3 to PAGE n belongs to the erase status E shown in FIG. 8. In this state, when the sensing operation is performed by simultaneously applying the read voltage VR to the first to n-th word lines WL1 to WLn, the bit stored in the first to m-th latches L1 to Lm is determined according to the threshold voltage of the memory cells of the first page PAGE 1 and the second page PAGE 2.

For example, when the threshold voltages of two memory cells connected to the first bit line BL1 among the memory cells included in the first and second pages PAGE 1 and PAGE 2 belong to the erase status E, the bit stored in the first latch L1 after the sensing operation may be "1." In addition, when the threshold voltage of at least one of the two memory cells connected to the first bit line BL1 among the memory cells included in the first and second pages PAGE 1 and PAGE 2 belongs to the program status PV, the bit stored in the first latch L1 may be "0."

Considering that data input to the semiconductor memory device 100 and programmed in each of pages is randomized data, a ratio of "1" to "0" among bit data stored in the memory cells of each page may be generally close to 1:1. Therefore, in an example of FIG. 9A, when the read voltage VR is applied to all word lines in a state in which one physical page is programmed, the ratio of "1" to "0" in bit data stored in the first to m-th latches L1 to Lm may be generally close to 1:1.

Meanwhile, in an example of FIG. 9B, when the sensing operation is performed by applying the read voltage VR to all word lines in a state in which two physical pages are programmed, the ratio of "1" may decrease and the ratio of "0" may increase in the bit data stored in the first to m-th latches L1 to Lm. This is because when both of the threshold voltages of two memory cells connected through the same bit line are in the erase status E, a bit of "1" is stored in a corresponding latch, and when the threshold voltage of at least one of the two memory cells connected through the same bit line is in the program status PV, a bit of "0" is stored in the corresponding latch. That is, statistically, the bit of "1" may be stored in the latch with a probability of 25%, and the bit of "0" may be stored in the latch with a probability of 75%.

In a similar method, in a case where the first to third pages PAGE 1 to PAGE 3 are in the programmed status and the fourth to n-th pages PAGE 4 to PAGE n are in the erase status, when the sensing operation is performed by simultaneously applying the read voltage VR to the first to n-th word line WL1 to WLn, 12.5% of the first to m-th latches L1 to Lm may store the bit of "1," and 87.5% of the first to m-th latches L1 to Lm may store the bit of "0." In a case where several pages are further programmed, among the first to m-th latches L1 to Lm, when the sensing operation is performed by simultaneously applying the read voltage VR to the first to n-th word lines WL1 to WLn, most latches among the first to m-th latches may store the bit of "0," and very few latches may store the bit of "1." Therefore, in such a method, it is difficult for the status checker 160 to check the ratio of the programmed page in the memory block.

Therefore, according to the present disclosure, in order to check the ratio of the programmed page in one memory block, a sensing operation is performed by applying a check voltage VC greater than the read voltage VR to the word lines. Hereinafter, an operation of the present disclosure using the check voltage VC is described with reference to FIGS. 10 to 11B.

Figure 10:
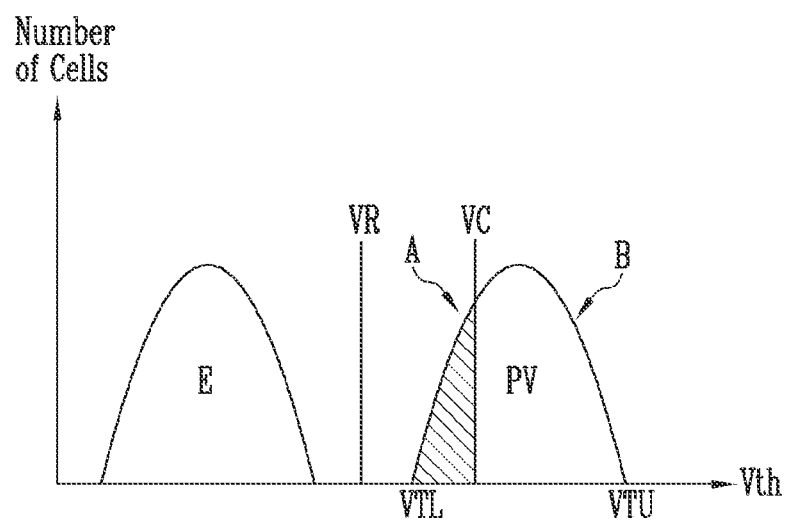
FIG. 10 is a graph illustrating a check voltage VC used to check a valid page ratio according to an embodiment of the present disclosure.

FIG. 10 is a graph illustrating a check voltage VC used to check a valid page ratio according to an embodiment of the present disclosure. Referring to FIG. 10, the check voltage VC has a voltage value greater than the read voltage VR. Specifically, the check voltage VC may have a value between a lower limit VTL and an upper limit VTU of the threshold voltage distribution of the program status PV. In particular, the lower limit VTL of the threshold voltage distribution of the program status PV may have a value similar to that of a verify operation used in the program operation. Accordingly, the check voltage VC according to the present disclosure may be a voltage greater than the verify voltage.

Memory cells belonging to the program status PV are divided into two groups by the check voltage VC according to the present disclosure. Memory cells belonging to a group A are memory cells that are in the program status PV but have a threshold voltage lower than the check voltage. In addition, memory cells belonging to a group B are in the program status PV but have a threshold voltage higher than the check voltage. When the sensing operation is performed by applying the check voltage VC shown in FIG. 10 to all word lines, the ratio of the bit of "1" among the bit data stored in the latch increases compared to a case where the read voltage VR is applied to the word lines.

Figure 11A:
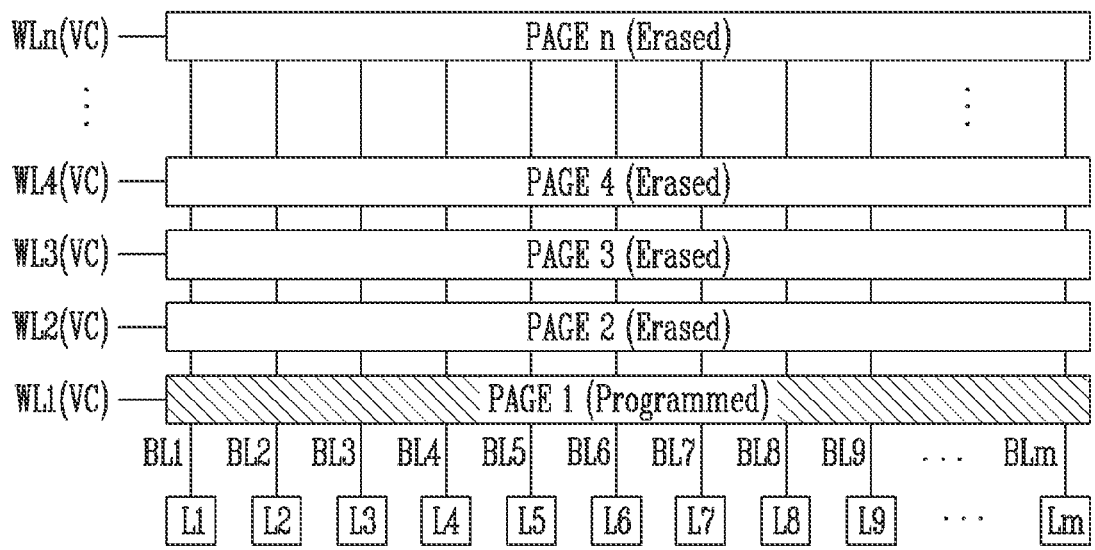
FIG. 11A is a block diagram illustrating a sensing operation of applying the check voltage VC to all word lines in a state in which one page among the pages included in the memory block is programmed.
Figure 11B:
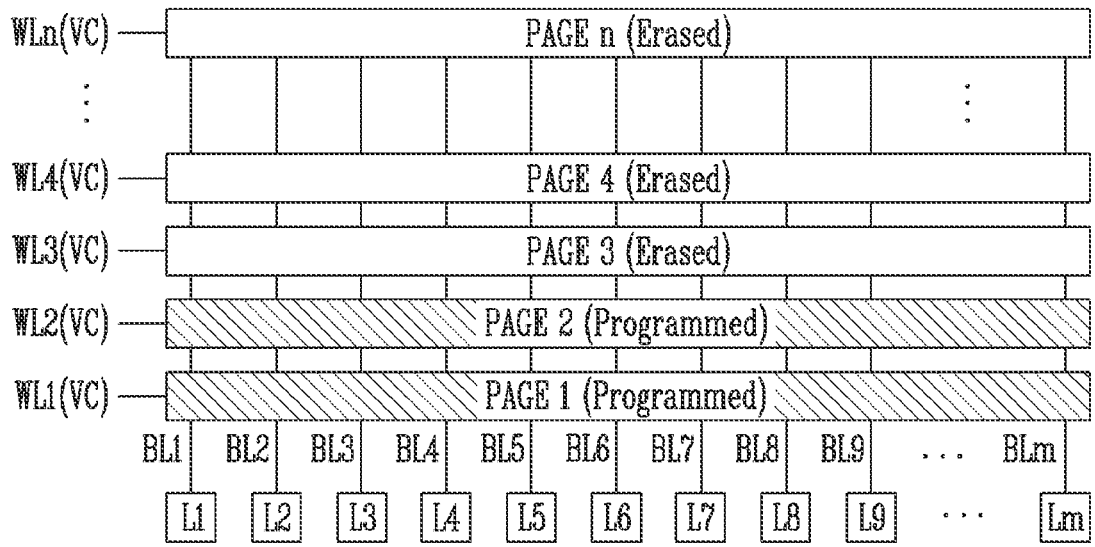
FIG. 11B is a block diagram illustrating the sensing operation of applying the check voltage VC to all word lines in a state in which two pages among the pages included in the memory block are programmed.

FIG. 11A is a block diagram illustrating the sensing operation of applying the check voltage VC to all word lines in a state in which one page among the pages included in the memory block is programmed. FIG. 11B is a block diagram illustrating the sensing operation of applying the check voltage VC to all word lines in a state in which two pages among the pages included in the memory block are programmed.

Referring to FIG. 11A, data is programmed in the first page PAGE 1, and the second to n-th pages PAGE 2 to PAGE n are in the erase status. In this case, the threshold voltage of the memory cells included in the first page PAGE 1 belongs to any one of the erase status E or the program status PV shown in FIG. 8. On the other hand, the threshold voltage of all memory cells included in the second to n-th pages PAGE 2 to PAGE n belongs to the erase status E shown in FIG. 8. In this state, when the sensing operation is performed by simultaneously applying the check voltage VC to the first to n-th word lines WL1 to WLn, the bit stored in the first to m-th latches L1 to Lm is determined according to the threshold voltage of the memory cells included in the first page PAGE 1. For example, when the threshold voltage of the memory cell connected to the first bit line BL1 among the memory cells included in the first page PAGE 1 belongs to the erase status E, the bit stored in the first latch L1 may be "1." In addition, for example, when the threshold voltage of the memory cell connected to the second bit line BL2 among the memory cells included in the first page PAGE 1 is lower than the check voltage VC even though the threshold voltage belongs to the program status PV, the bit stored in the second latch L2 may be "1." Meanwhile, when the threshold voltage of the memory cell connected to the third bit line BL3 among the memory cells included in the first page PAGE 1 is in the program status PV and is higher than the check voltage VC, the bit stored in the third latch L3 may be "0."

As described with reference to FIG. 9A, when the sensing operation is performed by applying the read voltage VR to all word lines WL1 to WLn in a state in which data is programmed in the first page PAGE 1, the ratio of "1" to "0" in the bit data stored in the first to m-th latches L1 to Lm may be generally close to 1:1. On the other hand, as described with reference to FIGS. 10 and 11A, when the sensing operation is performed by applying the check voltage VC to all word lines WL1 to WLn, the ratio of "1" among the bit data stored in the first to m-th latches L1 to Lm may be higher than the ratio of "0." For example, when a ratio of the memory cells belonging to the group A to the memory cells belonging to the group B is 2:3, the sensing operation is performed by applying the check voltage VC to all word lines WL1 to WLn, the ratio of the latches storing the bit of "1" among the first to m-th latches L1 to Lm may be about 70%, and the ratio of the latches storing the bit of "0" may be about 30%. As a magnitude of the check voltage VC increases, the ratio of the latches storing the bit of "1" among the first to m-th latches L1 to Lm may increase, and the ratio of the latches storing the bit of "0" may decrease.

Referring to FIG. 11B, data is programmed in the first page PAGE 1 and the second page PAGE 2, and the third to n-th pages PAGE 3 to PAGE n are in the erase status. In this case, the threshold voltage of the memory cells included in the first page PAGE 1 and the second page PAGE 2 belongs to any one of the erase status E or the program status PV shown in FIG. 8. On the other hand, the threshold voltage of all memory cells included in the third to n-th pages PAGE 3 to PAGE n belongs to the erase status E shown in FIG. 8. In this state, when the check voltage VC is simultaneously applied to the first to n-th word lines WL1 to WLn, the bit stored in the first to m-th latches L1 to Lm is determined according to the threshold voltage of the memory cells of the first page PAGE 1 and the memory cells of the second page PAGE 2.

For example, when both of the threshold voltages of two memory cells connected to the first bit line BL1 among the memory cells included in the first and second pages PAGE 1 and PAGE 2 are lower than the check voltage VC, the bit stored in the first latch L1 may be "1." In addition, when the threshold voltage of at least one of the two memory cells connected to the first bit line BL1 among the memory cells included in the first and second pages PAGE 1 and PAGE 2 is higher than the check voltage VC, the bit stored in the first latch L1 may be "0."

For example, in a case where the ratio of the memory cells belonging to the group A to the memory cells belonging to the group B is 2:3, when the sensing operation is performed by applying the check voltage VC to all word lines WL1 to WLn, the ratio of the latches storing the bit of "1" among the first to m-th latches L1 to Lm may be about 49%, and the ratio of the latches storing the bit of "0" may be about 51%.

In a similar method, when the first to third pages PAGE 1 to PAGE 3 are in the programmed status and the fourth to n-th pages PAGE 4 to PAGE n are in the erase status, when the sensing operation is performed by simultaneously applying the check voltage VC to the first to n-th word lines WL1 to WLn, about 34.3% of the first to m-th latches L1 to Lm may store the bit of "1," and 65.7% of the first to the m-th latches L1 to Lm may store the bit of "0."

That is, in a case where the check voltage VC is appropriately set between the lower limit VTL and the upper limit VTU of the threshold voltage distribution of the program status PV, when the sensing operation is performed by applying the check voltage VC to all word lines connected to the memory block, the number of latches storing the bit of "0" among the first to m-th latches L1 to Lm may increase as the ratio of the programmed page in the memory block increases. Therefore, the status checker 160 may statistically check the ratio of the programmed page in the memory block by the ratio of the latch storing the bit of "0" among the first to m-th latches L1 to Lm. As the number of physical pages in one memory block increases, it is preferable to set the check voltage VC to be relatively larger.

Figure 12:
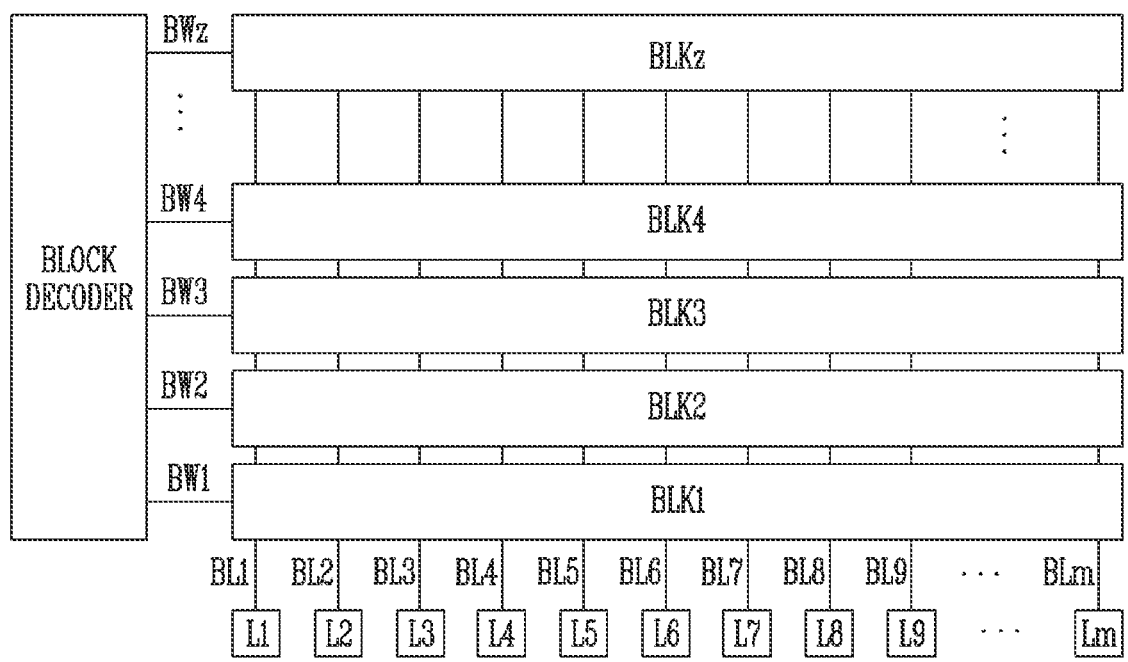
FIG. 12 is a block diagram illustrating an operation of checking a ratio of a programmed page among all pages in the semiconductor memory device.

FIG. 12 is a block diagram illustrating an operation of checking the ratio of the programmed page among all pages in the semiconductor memory device. Referring to FIG. 12, first to z-th memory blocks BLK1 to BLKz may be connected to the first to m-th latches L1 to Lm through the bit lines BL1 to BLm. In addition, each of the first to z-th memory blocks BLK1 to BLKz is connected to a block decoder through block word lines BW1 to BWz. The block decoder may select a corresponding memory block by activating a selected block word line among the block word lines BW1 to BWz. The block decoder may be included in the address decoder 120 of FIG. 2.

The method of checking the ratio of the programmed page in one memory block is described with reference to FIGS. 10 to 11B. According to the present disclosure, in order to check the ratio of the programmed page among all pages included in the semiconductor memory device 100, the block decoder may activate all block word lines BW1 to BWz. Accordingly, all memory blocks are activated.

In a state in which all memory blocks are activated, the sensing operation is performed by applying the check voltage VC to all word lines connected to each of the memory blocks. In this case, according to the ratio of the programmed page among all pages included in the semiconductor memory device 100, the ratio of the latch storing the bit "0" among the first to m-th latches L1 to Lm may be determined. In a state in which the bit data of the latches are stored as described above, as described with reference to FIG. 6, the status checker 160 may generate the program status information INF_PGM based on the current generated according to the bits stored in the first to m-th latches L1 to Lm.

Therefore, according to the present disclosure, the ratio of the programmed page among all pages included in the semiconductor memory device 100 may be checked by performing the sensing operation by applying the check voltage VC to all word lines connected to each of the memory blocks in a state in which all memory blocks are activated.

Figures 13, 14:
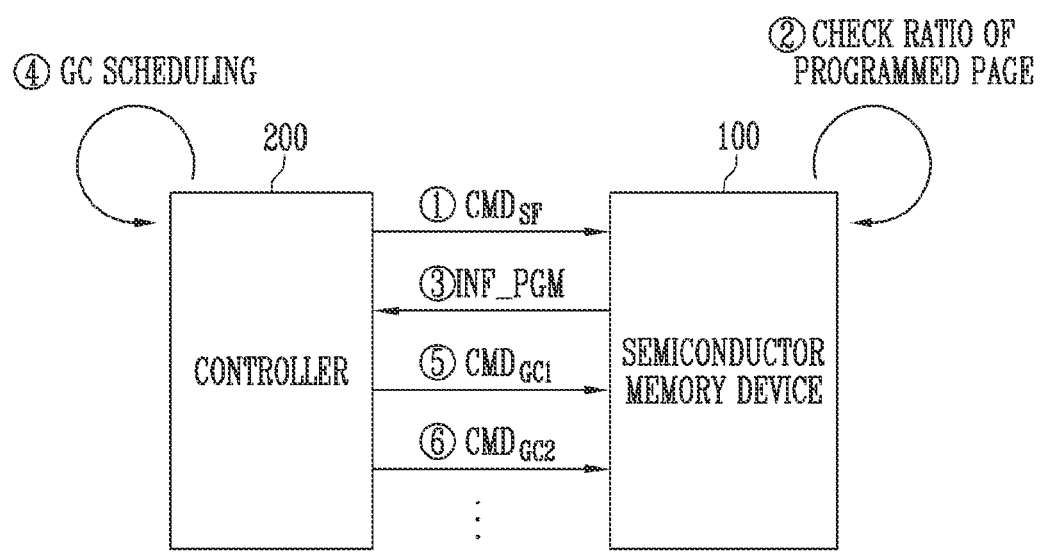
FIG. 13 is a table illustrating program information of FIG. 6.
FIG. 14 is a diagram illustrating operations of a controller and a semiconductor memory device according to an embodiment of the present disclosure.

FIG. 13 is a table illustrating the program information of FIG. 6.

Referring to FIG. 13, the code according to the ratio of the programmed page is illustrated. The code generator 167 may calculate the ratio of the programmed physical page, based on the digital value $D_N$ corresponding to the number of physical pages of the erase status, which are not programmed, According to the table shown in FIG. 13, a total of three codes may be generated according to a range to which the ratio of the programmed physical page belongs. For example, when the ratio of the programmed physical page is less than 50%, a first code CODE1 may be included in the program status information INF_PGM. When the ratio of the programmed physical page is equal to or greater than 50% and equal to or less than 90%, a second code CODE2 may be included in the program status information INF_PGM. When the ratio of the programmed physical page exceeds 90%, a third code CODE3 may be included in the program status information INF_PGM. According to that shown in FIG. 13, any one code among the three codes CODE1 to CODE3 is included in the program status information INF_PGM. Therefore, the code included in the program status information INF_PGM may be divided with two bits. However, this is an example, and codes for more various ranges may be subdivided. For example, according to the range to which the ratio of the programmed physical page belongs, a total of eight codes may be generated. In this case, the code included in the program status information INF_PGM may be divided with three bits.

As described with reference to FIGS. 6 and 13, the status checker 160 may determine the ratio of the programmed page based on the number of programmed physical pages or physical pages which are not programmed, and thus may generate the program status information INF_PGM including a corresponding code. The generated program status information INF_PGM may be stored in the status storage device 170 and may be transmitted to the controller 200. The controller 200 may receive the program status information INF_PGM, check the ratio of the programmed page among the pages included in the semiconductor memory device 100, and establish the garbage collection policy based on the ratio.

FIG. 14 is a diagram illustrating operations of a controller and a semiconductor memory device according to an embodiment of the present disclosure.

Referring to FIG. 14, the controller 200 may transmit a set feature command $CMD_{SF}$ to the semiconductor memory device 100 (①). The set-feature command $CMD_{SF}$ is a command for checking the ratio of the programmed page among the physical pages of the semiconductor memory device 100. The semiconductor memory device 100 checks the ratio of the programmed page among the physical pages included in the semiconductor memory device 100 in response to the set-feature command $CMD_{SF}$ (②). To this end, the status checker 160 may check the ratio of the programmed page based on the ratio of "0" in the bit data stored in the first to m-th latches L1 to Lm, and generate the program status information INF_PGM including the code corresponding to the checked ratio. The generated program status information INF_PGM may be stored in the status storage device 170.

The semiconductor memory device 100 may transmit the generated program status information INF_PGM to the controller 200 (③). The controller 200 may check the ratio of the programmed page in the semiconductor memory device 100 through the received program status information INF_PGM. Meanwhile, the controller 200 may establish the garbage collection policy based on the ratio of the programmed page. In addition, the controller 200 may schedule the garbage collection operation on the semiconductor memory device 100, based on the established garbage collection policy (④). The controller 200 may transmit a first command $CMD_{GC1}$ for controlling the semiconductor memory device 100 to perform the scheduled garbage collection operation to the semiconductor memory device 100 (⑤). In addition, the controller 200 may transmit a second command $CMD_{GC2}$ for controlling the semiconductor memory device 100 to perform the scheduled garbage collection operation to the semiconductor memory device 100 (⑥).

FIG. 15 is a table illustrating an example of the garbage collection policy according to the program information.

Referring to FIG. 15, the controller 200 may determine the garbage collection policy based on the code included in the program status information INF_PGM. When the program status information INF_PGM includes the first code CODE1, this means that the ratio of the programmed page in the semiconductor memory device 100 is less than 50%. Therefore, the controller 200 may determine the garbage collection policy so that the garbage collection operation is performed at the first frequency, which is a relatively low frequency. In this case, the garbage collection operation may be performed in the background of the memory system 1000.

Meanwhile, when the program status information INF_PGM includes the second code CODE2, this means that the ratio of the programmed page in the semiconductor memory device 100 is equal to or greater than 50% and equal to or less than 90%. Therefore, the controller 200 may determine the garbage collection policy so that the garbage collection operation is performed at the second frequency higher than the first frequency. Also in this case, the garbage collection operation may be performed in the background of the memory system 1000.

Finally, when the program status information INF_PGM includes the third code CODE3, this means that the ratio of the programmed page in the semiconductor memory device 100 exceeds 90%. Therefore, the controller 200 may determine the garbage collection policy so that the garbage collection operation is forcibly performed. The forcible garbage collection policy is a garbage collection policy to perform the garbage collection operation on the semiconductor memory device 100 before the program operation according to the write request is performed whenever the memory system 1000 receives the write request from the host 300. Therefore, in this case, the garbage collection operation may be performed in the foreground of the memory system 1000.

Figure 16:
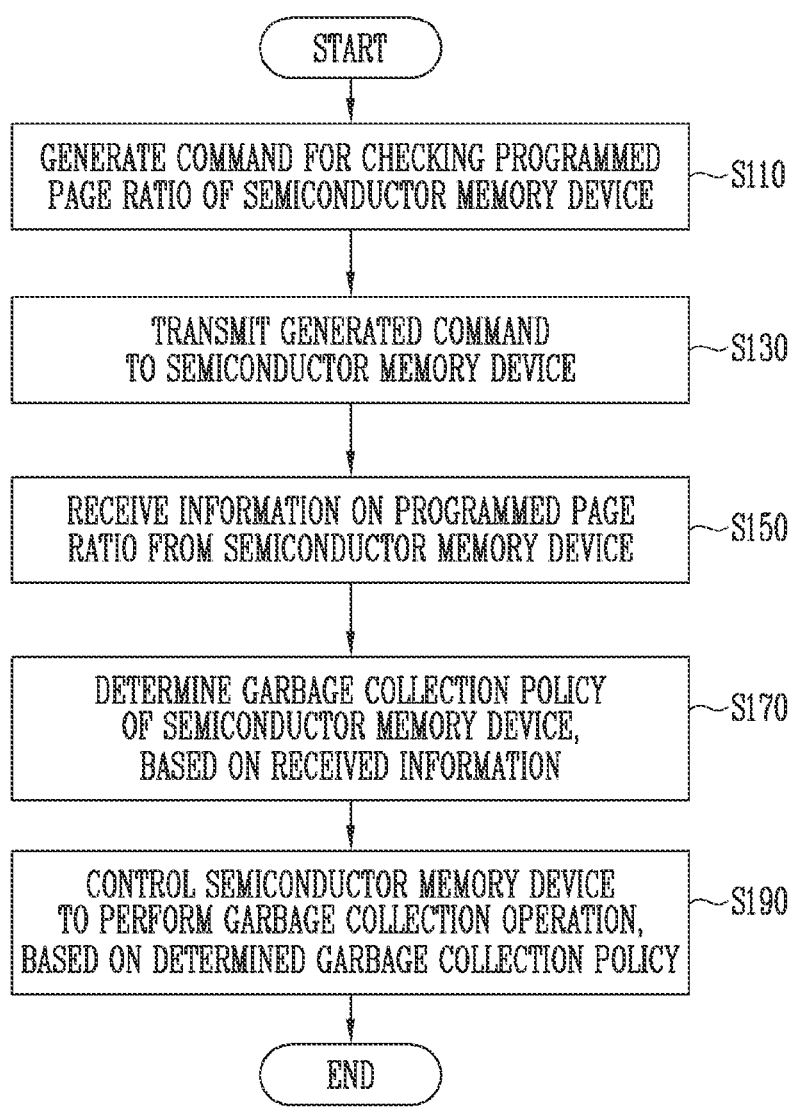
FIG. 16 is a flowchart illustrating a method of operating a controller according to an embodiment of the present disclosure.

FIG. 16 is a flowchart illustrating a method of operating a controller according to an embodiment of the present disclosure.

Referring to FIG. 16, the method of operating the controller includes generating a command for checking a programmed page ratio of a semiconductor memory device (S110), transmitting the generated command to the semiconductor memory device (S130), receiving information on the programmed page ratio from the semiconductor memory device (S150), determining a garbage collection policy of the semiconductor memory device, based on the received information (S170), and controlling the semiconductor memory device to perform a garbage collection operation based on the determined garbage collection policy (S190). Hereinafter, the present disclosure is described with reference to FIG. 14 together.

In step S110, the controller 200 may generate the set-feature command $CMD_{SF}$. The set-feature command $CMD_{SF}$ is a command for checking the ratio of the programmed page among the physical pages of the semiconductor memory device 100.

In step S130, the controller 200 transmits the generated set-feature command $CMD_{SF}$ to the semiconductor memory device 100. The semiconductor memory device 100 may check the ratio of the programmed page among the physical pages included in the semiconductor memory device 100 in response to the set-feature command $CMD_{SF}$. Meanwhile, as a result of the check, the semiconductor memory device 100 may generate the program status information INF_PGM.

In step S150, the controller 200 receives the program status information INF_PGM from the semiconductor memory device. The program status information INF_PGM may include the code related to the ratio of the programmed page. In step S170, the controller 200 determines the garbage collection policy of the semiconductor memory device based on the program status information INF_PGM. As shown in the table shown in FIG. 15, the controller 200 may determine whether to perform garbage collection in the background or forcibly in the foreground according to the code value included in the program status information INF_PGM. In addition, the controller 200 may determine the frequency at which the garbage collection is performed when the garbage collection is performed in the background.

In step S190, the semiconductor memory device 100 may be controlled to specifically perform the garbage collection operation, based on the determined garbage collection policy.

Figure 17:
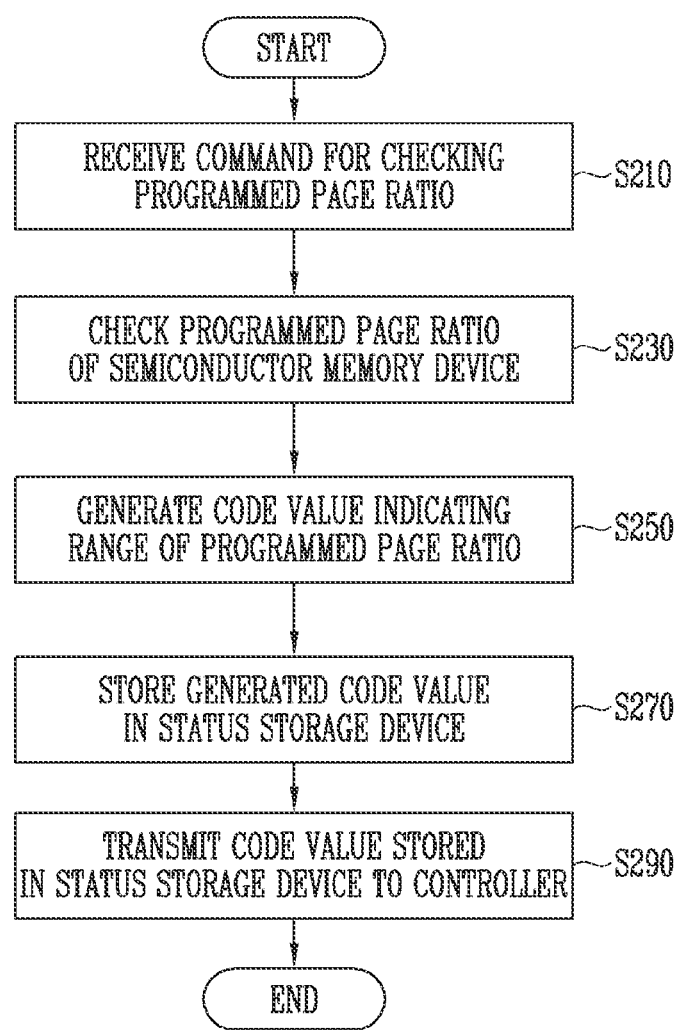
FIG. 17 is a flowchart illustrating a method of operating a semiconductor memory device according to another embodiment of the present disclosure.

FIG. 17 is a flowchart illustrating a method of operating a semiconductor memory device according to another embodiment of the present disclosure.

Referring to FIG. 17, the method of operating the semiconductor memory device includes receiving a command for checking a programmed page ratio from a controller (S210), checking the programmed page ratio of the semiconductor memory device (S230), generating a code value indicating a range of the programmed page ratio (S250), storing the generated code value in a status storage device (S270), and transmitting the code value stored in the status storage device to the controller (S290). Hereinafter, the present disclosure is described with reference to FIG. 14 together.

In step S210, the semiconductor memory device 100 may receive the set-feature command $CMD_{SF}$ from the controller 200. As described above, the set-feature command $CMD_{SF}$ is the command for checking the ratio of the programmed page among the physical pages of the semiconductor memory device 100.

In step S230, the semiconductor memory device 100 checks the ratio of the programmed page among the physical pages included in the semiconductor memory device 100 in response to the set-feature command $CMD_{SF}$. To this end, as described with reference to FIGS. 6 to 12, the status checker 160 may check the ratio of "0" in the bits stored in the first to m-th latches L1 to Lm, and check the ratio of the programmed page based on the ratio of "0."

In step S250, the semiconductor memory device 100 may generate the program status information INF_PGM including the code corresponding to the checked ratio. As shown in FIG. 13, the semiconductor memory device 100 may generate the program status information INF_PGM to include the code determined according to the range to which the ratio of the programmed page belongs.

In step S270, the semiconductor memory device 100 may store the generated program status information INF_PGM in the status storage device 170. As described above, the status storage device 170 may be configured as the status register.

In step S290, the semiconductor memory device 100 may transmit the program status information INF_PGM stored in the status storage device 170 to the controller 200. The controller 200 may establish the garbage collection policy based on the received program status information INF_PGM.

Figure 18:
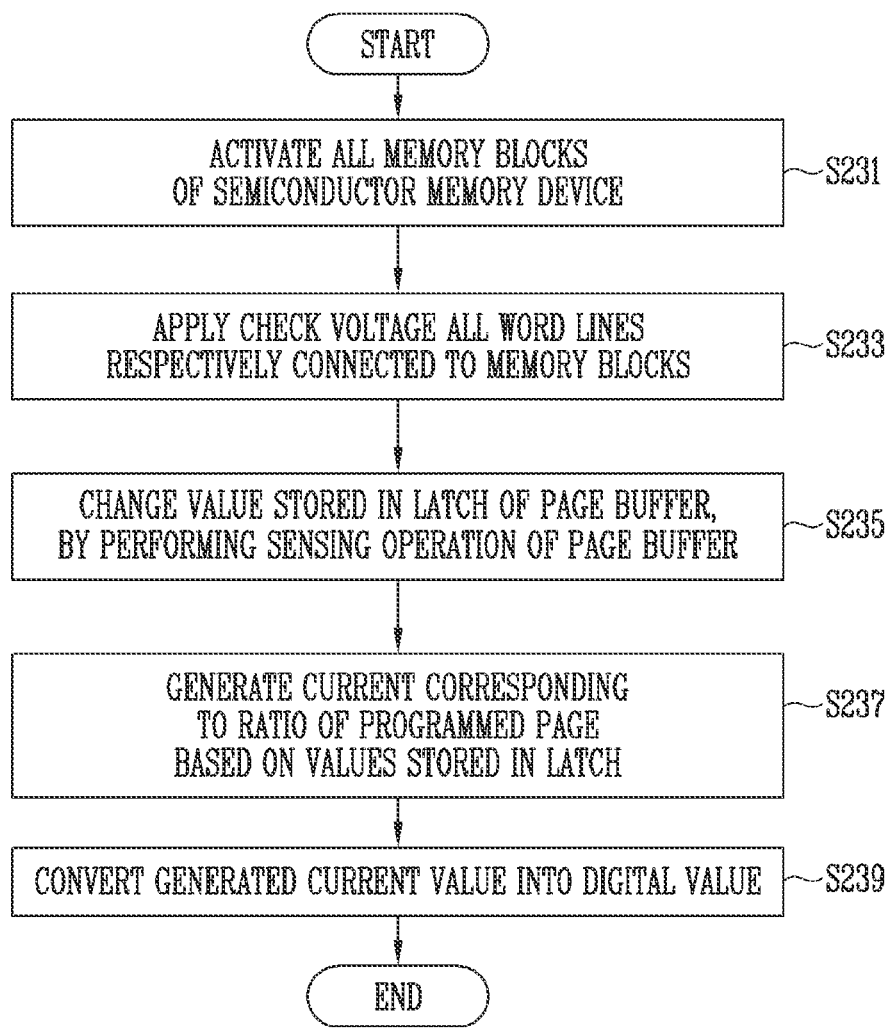
FIG. 18 is a flowchart illustrating a specific embodiment of step S230 of FIG. 17.

FIG. 18 is a flowchart illustrating a specific embodiment of step S230 of FIG. 17.

Referring to FIG. 18, checking the programmed page ratio of the semiconductor memory device (S230) includes activating all memory blocks BLK1 to BLKz of the semiconductor memory device 100 (S231), applying the check voltage VC to all word lines WL1 to Win respectively connected to the memory blocks BLK1 to BLKz (S233), performing the sensing operation of the page buffer to change a value stored in the latch of the page buffer (S235), generating a current corresponding to the ratio of the programmed page based on the values stored in the latch (S237), and converting the generated current value into a digital value (S239).

In step S231, as described with reference to FIG. 12, the block decoder may activate all block word lines BW1 to BWz to activate all memory blocks BLK1 to BLKz.

In step S233, the check voltage VC greater than the read voltage VR is applied to all word lines WL1 to WLn respectively connected to the memory blocks BLK1 to BLKz. The check voltage VC may be determined in consideration of the number of memory blocks, the number of physical pages included in one memory block, and threshold voltage lower limit VTL and upper limit VTU of the program status PV. As the number of memory blocks increases and the number of physical pages included in one memory block increases, it is preferable to determine a relatively high voltage as the check voltage VC.

In step S235, the sensing operation of the page buffer is performed to change the value stored in the latch of the page buffer. Because the check voltage VC is a value between the threshold voltage lower limit VTL and upper limit VTU of the program status PV, the ratio of the latch storing the bit of "0" among the latches of the page buffer may be determined according to the programmed page ratio among the physical pages included in the semiconductor memory device 100.

In step S237, the current corresponding to the ratio of the programmed page is generated based on the values stored in the latch. As described above with reference to FIG. 6, the sensing current generator 161, the current mirror 163, and the comparison current generator 165 among the components of the status checker 160 may generate the current $I_N$, based on the bit data stored in the latch. The current $I_N$ is input to the analog-to-digital converter 166.

In step S239, the generated current value is converted into a digital value. Specifically, the analog-to-digital converter 166 of the status checker 160 converts the input current $I_N$ into the digital value $D_N$.

Figure 19:
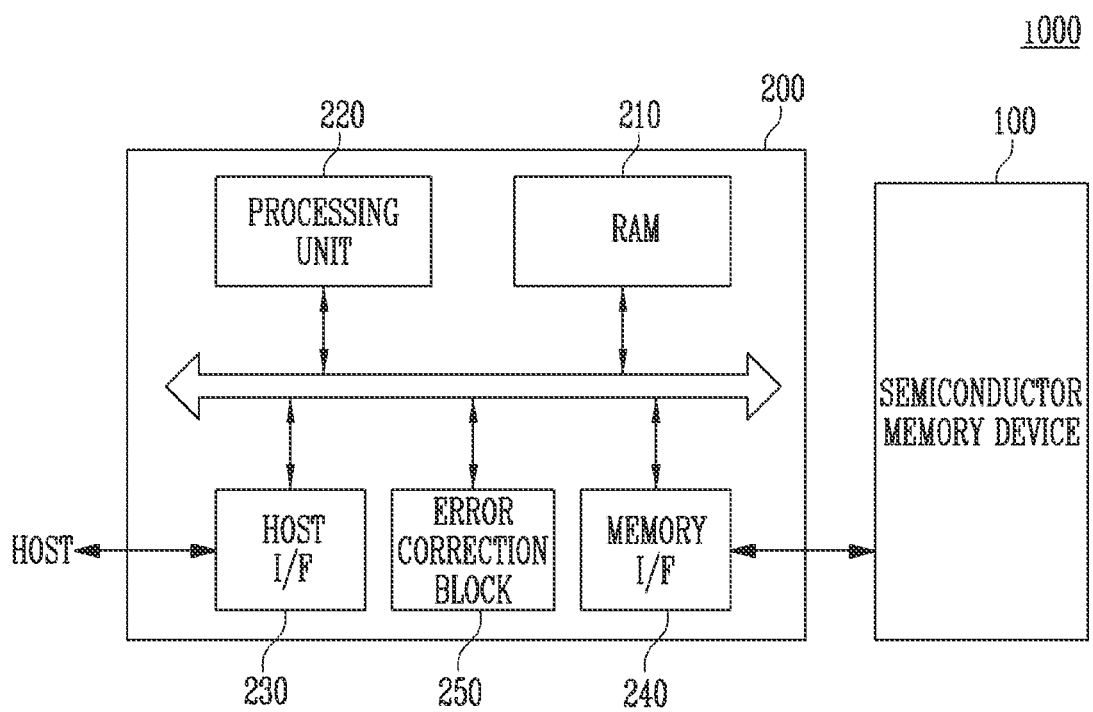
FIG. 19 is a block diagram illustrating an example of the controller shown in FIG. 1.

FIG. 19 is a block diagram illustrating an example of the controller 200 of the memory system 1000 shown in FIG. 1.

Referring to FIG. 19, the controller 200 is connected to the semiconductor memory device 100 and a host HOST. The semiconductor memory device 100 may be the semiconductor memory device described with reference to FIG. 2.

The controller 200 is configured to access the semiconductor memory device 100 in response to a request from the host Host. For example, the controller 200 is configured to control read, write, erase, and background operations of the semiconductor memory device 100. The controller 200 is configured to provide an interface between the semiconductor memory device 100 and the host Host. The controller 200 is configured to drive firmware for controlling the semiconductor memory device 100.

The controller 200 includes random access memory (RAM) 210, a processing unit 220, a host interface 230, a memory interface 240, and an error correction block 250. The RAM 210 is used as at least one of operation memory of the processing unit 220, cache memory between the semiconductor memory device 100 and the host Host, and buffer memory between the semiconductor memory device 100 and the host Host.

The processing unit 220 controls overall operation of the controller 200.

The host interface 230 includes a protocol for performing data exchange between the host Host and the controller 200. As an embodiment, the controller 200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 240 interfaces with the semiconductor memory device 100. For example, the memory interface 240 includes a NAND interface or a NOR interface.

The error correction block 250 is configured to detect and correct an error of data received from the semiconductor memory device 100 using an error correcting code (ECC). The processing unit 220 may control the semiconductor memory device 100 to adjust a read voltage and perform a re-read according to an error detection result of the error correction block 250.

The controller 200 and the semiconductor memory device 100 may be integrated into one semiconductor device. As an embodiment, the controller 200 and the semiconductor memory device 100 may be integrated into one semiconductor device to form a memory card. For example, the controller 200 and the semiconductor memory device 100 may be integrated into one semiconductor device to form a memory card such as a (personal computer memory card international PC card association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) includes the memory system 1000 configured to store data in a semiconductor memory. When the memory system 1000 including the controller 200 and the semiconductor memory device 100 is used as the semiconductor drive (SSD), an operation speed of the host connected to the memory system 1000 may be improved.

As another example, the memory system 1000 including the controller 200 and the semiconductor memory device 100 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an embodiment, the semiconductor memory device 100 and the memory system 1000 including the same may be mounted as a package of various types. For example, the semiconductor memory device 100 or the memory system 1000 may be packaged and mounted in a method such as a package on package (POP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 20:
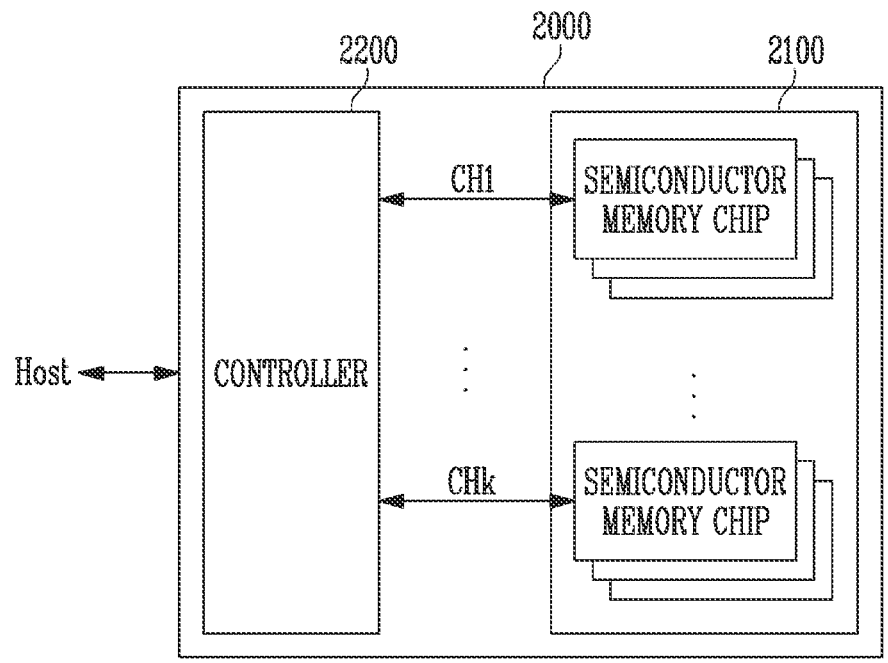
FIG. 20 is a block diagram illustrating an application example of a memory system of FIG. 19.

FIG. 20 is a block diagram illustrating an application example of a memory system such as the memory system 1000 of FIG. 19.

Referring to FIG. 20, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 20, the plurality of groups communicate with the controller 2200 through first to k-th channels CH1 to CHK, respectively. Each semiconductor memory chip is configured and is operated similarly to that of the semiconductor memory device 100 described with reference to FIG. 2.

Each group is configured to communicate with the controller 2200 through one common channel. The controller 2200 is configured similarly to the controller 200 described with reference to FIG. 19 and is configured to control the plurality of memory chips of the semiconductor memory device 2100 through the plurality of channels CH1 to CHk.

Figure 21:
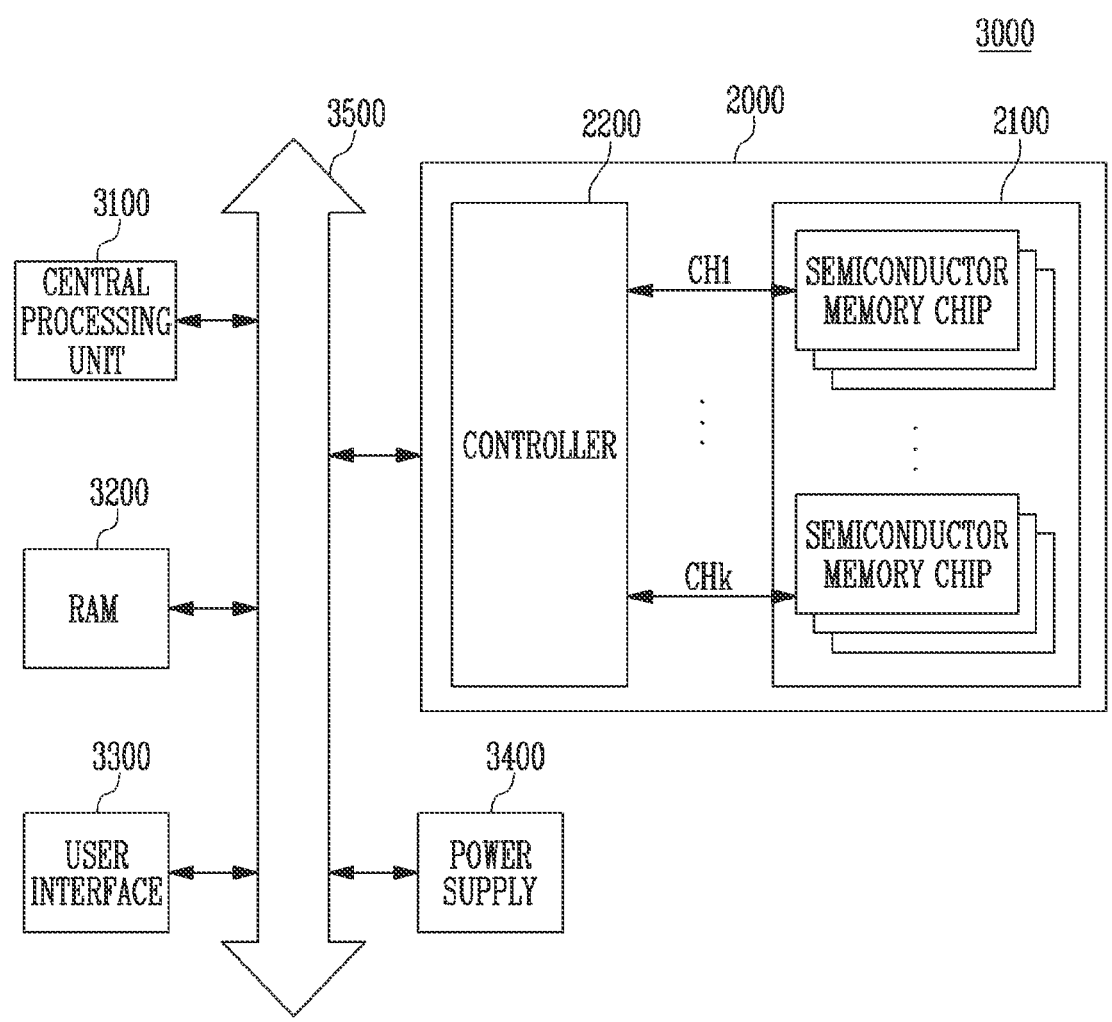
FIG. 21 is a block diagram illustrating a computing system including the memory system described with reference to FIG. 20.

FIG. 21 is a block diagram illustrating a computing system 3000 including the memory system 2000 described with reference to FIG. 20.

The computing system 3000 includes a central processing unit 3100, random access memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 21, the semiconductor memory device 2100 is connected to the system bus 3500 through the controller 2200. However, the semiconductor memory device 2100 may be directly connected to the system bus 3500. In such case, a function of the controller 2200 is performed by the central processing unit 3100 and the RAM 3200.

In FIG. 21, the memory system 2000 described with reference to FIG. 20 is illustrated. However, the memory system 2000 may be replaced with the memory system 1000 including the controller 200 and the semiconductor memory device 100 described with reference to FIG. 19.

The embodiments of the present disclosure disclosed in the present specification and drawings are merely provided with specific examples to describe the technical content of the present disclosure and to help understanding of the present disclosure, and are not intended to limit the scope of the present disclosure. Those of ordinary skill in the art will understand that other modified examples based on the technical spirit of the present disclosure may be implemented in addition to the embodiments disclosed herein.

What is claimed is:
1. A semiconductor memory device comprising:
   a plurality of memory blocks each including a plurality of physical pages;

a peripheral circuit configured to perform a program operation, an erase operation, or a read operation on a selected memory block among the plurality of memory blocks;
control logic capable of controlling the program operation, the erase operation, or the read operation of the peripheral circuit; and
a status checker configured to check a ratio of programmed pages among the physical pages included in the plurality of memory blocks,
wherein the peripheral circuit includes a plurality of page buffers connected to the plurality of memory blocks through bit lines,
each of the plurality of page buffers includes a respective one of a plurality of latches, and
the status checker is configured to check the ratio of the programmed pages based on data stored in the plurality of latches.

2. The semiconductor memory device of claim 1, further comprising:
a status storage device configured to store information indicating the ratio of the programmed pages.

3. The semiconductor memory device of claim 2, wherein the status storage device comprises at least one status register.

4. The semiconductor memory device of claim 1, wherein the status checker comprises:
a sensing current generator connected to the plurality of latches, the sensing current generator configured to generate a first current corresponding to the number of physical pages which are not programmed;
a current mirror configured to generate a second current of the same magnitude as the first current;
a comparison current generator configured to generate a third current to be compared with the second current;
an analog-to-digital converter capable of converting a difference value between the second current and the third current into a digital value; and
a code generator capable of generating information indicating the ratio of the programmed pages, based on the digital value.

5. The semiconductor memory device of claim 4, wherein the code generator includes a lookup table for generating a code value corresponding to the digital value.

6. The semiconductor memory device of claim 1, wherein the control logic is capable of controlling the peripheral circuit to:
activate all of the plurality of memory blocks,
apply a check voltage to a plurality of word lines connected to the plurality of memory blocks, and
perform a sensing operation through the bit lines.

7. The semiconductor memory device of claim 6, wherein the check voltage has a voltage value greater than a lower limit of a threshold voltage distribution of memory cells of a program status.

8. A method of operating a semiconductor memory device including a memory block that includes a plurality of pages and a page buffer connected to the memory block through a bit line, the method comprising:
receiving a command for checking a ratio of programmed pages among the plurality of pages;
checking the ratio of the programmed pages among the plurality of pages based on a value stored in a latch included in the page buffer; and
generating a code value for the checked ratio based on a range of ratios to which the checked ratio belongs.

9. The method of claim 8, wherein N ranges are determined by dividing a range of possible ratios into N intervals with N being a natural number greater than 1, and
generating the code value for the checked ratio based on the range of the ratios to which the checked ratio belongs comprises generating a code value indicating a corresponding range among the N ranges.

10. The method of claim 8, further comprising:
storing the generated code value.

11. The method of claim 8, further comprising:
outputting the generated code value.

12. The method of claim 8, wherein checking the ratio of the programmed pages among the plurality of pages comprises:
applying a check voltage to all word lines connected to the plurality of pages;
changing the value stored in the latch by performing a sensing operation;
generating a current corresponding to the ratio of the programmed pages among the plurality of pages, based on the value stored in the latch; and
converting an analog value corresponding to the generated current into a digital value.

13. The method of claim 12, wherein the check voltage has a voltage value greater than a lower limit of a threshold voltage distribution of memory cells of a program status.

* * * * *